United States Patent [19]

Schwenk et al.

[11] Patent Number: 5,402,323

[45] Date of Patent: Mar. 28, 1995

[54] EQUIPMENT CABINET HAVING SPRING-ELASTIC SEALS

[75] Inventors: Hans M. Schwenk, Straubenhardt; Kurt Pohl, Munich; Gerhard Hüller, Reichersbeuren, all of Germany

[73] Assignee: Schroff GmbH, Straubenhardt, Germany

[21] Appl. No.: 931,475

[22] Filed: Aug. 19, 1992

[30] Foreign Application Priority Data

Aug. 20, 1991 [DE] Germany ............. 41 27 467.9

[51] Int. Cl.⁶ .......................................... H05K 9/00
[52] U.S. Cl. ................................. 361/816; 174/35 R
[58] Field of Search ........... 174/35 R, 35 MS, 35 GC, 174/35 TS; 361/424, 816–818; 439/607–610; 343/841; 358/255; 338/64; 334/85; 336/84 R, 84 C; 333/12; 331/67; 307/91; 315/85; 330/68; 329/318, 349; 250/505.1, 506.1, 507.1, 515.1, 517.1, 519.1; 312/296, 297; 49/472–474, 475.1

[56] References Cited

U.S. PATENT DOCUMENTS

| 2,206,755 | 7/1940 | Schweller | 312/296 |
|---|---|---|---|
| 2,270,844 | 1/1942 | Hedlund | 312/296 |
| 2,899,256 | 8/1959 | Kelley | 312/296 |
| 2,975,013 | 3/1961 | Wallace et al. | 312/296 |
| 4,068,087 | 1/1978 | Ristig | 174/35 MS |
| 4,677,251 | 6/1987 | Merewether | 174/35 MS |
| 4,760,496 | 7/1988 | Koch | 361/424 |
| 4,864,076 | 9/1989 | Stickney | 174/35 GC |

FOREIGN PATENT DOCUMENTS

| 0210525 | 2/1987 | European Pat. Off. . |
| 3611693 | 5/1987 | Germany . |
| 9100798 | 5/1991 | Germany . |
| 4013381 | 7/1991 | Germany . |

*Primary Examiner*—Bot Ledynh
*Attorney, Agent, or Firm*—Spencer, Frank & Schneider

[57] ABSTRACT

An equipment cabinet for insertable electrical and electronic units includes stationary casing components and a door pivotally attached by means of hinges. The door and the end faces of the casing components disposed opposite thereto are each provided with peripheral edge strips which are bent inwardly at an acute angle of preferably 45° and have parallel sealing faces that face one another at a slight distance. Between the sealing faces, spring-elastic seals are provided that may be composed of contact strips of an electrically well conducting material and rubber-elastic sealing strips arranged parallel thereto. Due to the sloped arrangement of the sealing faces, the spring forces F exerted by the seals are divided into two force components $F_1$ and $F_2$, with only the one force component $F_1$ having to be overcome when the door is pushed shut.

1 Claim, 2 Drawing Sheets

EQUIPMENT CABINET HAVING SPRING-ELASTIC SEALS

CROSS REFERENCE TO RELATED APPLICATION

This application claims the priority of application Ser. No. P 41 27 467.9, filed Aug. 20, 1991, in the Federal Republic of Germany, the subject matter of which is incorporated herein by reference.

BACKGROUND OF THE INVENTION

The present invention relates to an equipment cabinet for electrical and electronic insertable units and includes a rack for holding the insertable units, casing components fastened to the rack and at least one door which is pivotally attached by means of hinges.

Such equipment cabinets serve to accommodate electronic units that are constructed as standard components for a grid-type arrangement. The built-in components are easily accessible at any time through an openable door, for example, for maintenance purposes. In larger equipment cabinets the door simultaneously constitutes the front of the cabinet and is attached on a side by means of hinges in such a way that it can be opened from the front by pivoting it about the hinge axis.

The equipment cabinet serves, among others, the purpose of protecting the electronic units installed in its interior against interfering environmental influences. This includes dust and moisture, which are unavoidable particularly in the production area, as well as high frequency interfering radiation caused by other, insufficiently shielded electronic devices. While it is generally not difficult to sufficiently mechanically seal the gaps between the casing components that are fixed to the rack and to protect them against high frequency interference, a reliable and durable seal of the peripheral gap between the pivotal door and the fixed casing components opposite it constitutes a special problem. Typically rubber seals are used to protect against dust and moisture, contact strips made of spring-elastic electrically conductive material are used to provide a shield against high frequency electromagnetic radiation.

For higher demands with respect to mechanical and/or high frequency tightness, the problem arises, particularly in connection with large equipment cabinets and the corresponding large-area front doors, that a door equipped with the appropriate seals can be closed only by the exertion of considerable force. This often leads to the door being difficult to move, resulting in the door not being completely closed or not closed at all after a checking or maintenance process, thus negating any structural expenditures to obtain a good seal for the interior of the cabinet.

SUMMARY OF THE INVENTION

It is therefore an object of the present invention to make available an equipment cabinet that is provided with a pivotal door which meets the high demands for a seal around its peripheral edge while allowing the door to close properly without any major exertion of force.

The solution of this technical problem is based on an equipment cabinet of the above-mentioned type. This task is accomplished in that the door and the opening edges of the casing components facing the door are each provided with peripheral edge strips; these edge strips are each bent inwardly so as to form an acute angle of approximately 45° relative to the major surfaces of the door and the casing component, with these angles complementing one another to 90° at the respectively abutting edges of the door and the casing components; that further the edge strips support sealing faces that are arranged opposite them and extend parallel thereto at a slight distance; and that finally, spring-elastic seals are provided between these sealing faces of the edge strips.

In the equipment cabinet according to the invention, the sealing faces for the seals extend at an acute angle relative to the door surface and the respective casing component. The spring forces exerted by the spring-elastic seals on sloping sealing faces act perpendicularly to the sealing faces and thus also at corresponding angles relative to the planes of the door and the abutting casing components. The forces exerted by the spring-elastic seals can be separated vectorially into a first force component in the closing direction and a second force component transversely thereto, that is, parallel to the surface of the door. However, the latter force component need not be overcome when the door is pushed shut since it is absorbed by the door hinges. For that reason, it is no longer necessary to overcome the total spring force of the peripheral door seals but only the force component that is parallel to the closing direction. Thus the force to be exerted to close the door is considerably less than is the case for conventional sealing arrangements equipped with parallel and perpendicular sealing surfaces, respectively.

Preferably, the edge strips are bent inwardly at an angle of 45°. The closing force to be exerted is then reduced approximately by a factor of 0.7.

With the proposed invention, it is possible to improve the seal of the equipment cabinet against dust and moisture as well as against high frequency electromagnetic radiation. Thus contact strips made of a material that is a good conductor of electricity, for example in the form of spring contacts or spring-elastic braided metal structures, can be used in conjunction with rubber-elastic sealing strips to seal the cabinet.

Another great advantage of the structure according to the invention is the possibility of providing mechanical sealing strips and high frequency seals parallel to one another without increasing too much the force to be exerted to close the door. Preferably contact strips made of a conductive material, which serve to provide the high frequency seal, can be combined with parallel arranged rubber-elastic sealing strips which provide the seal against dust and moisture.

BRIEF DESCRIPTION OF THE DRAWINGS

One embodiment of the invention will now be described in greater detail with reference to the attached drawings in which.

DETAILED DESCRIPTION OF THE PREFERRED EMBODIMENT

Figure 1:
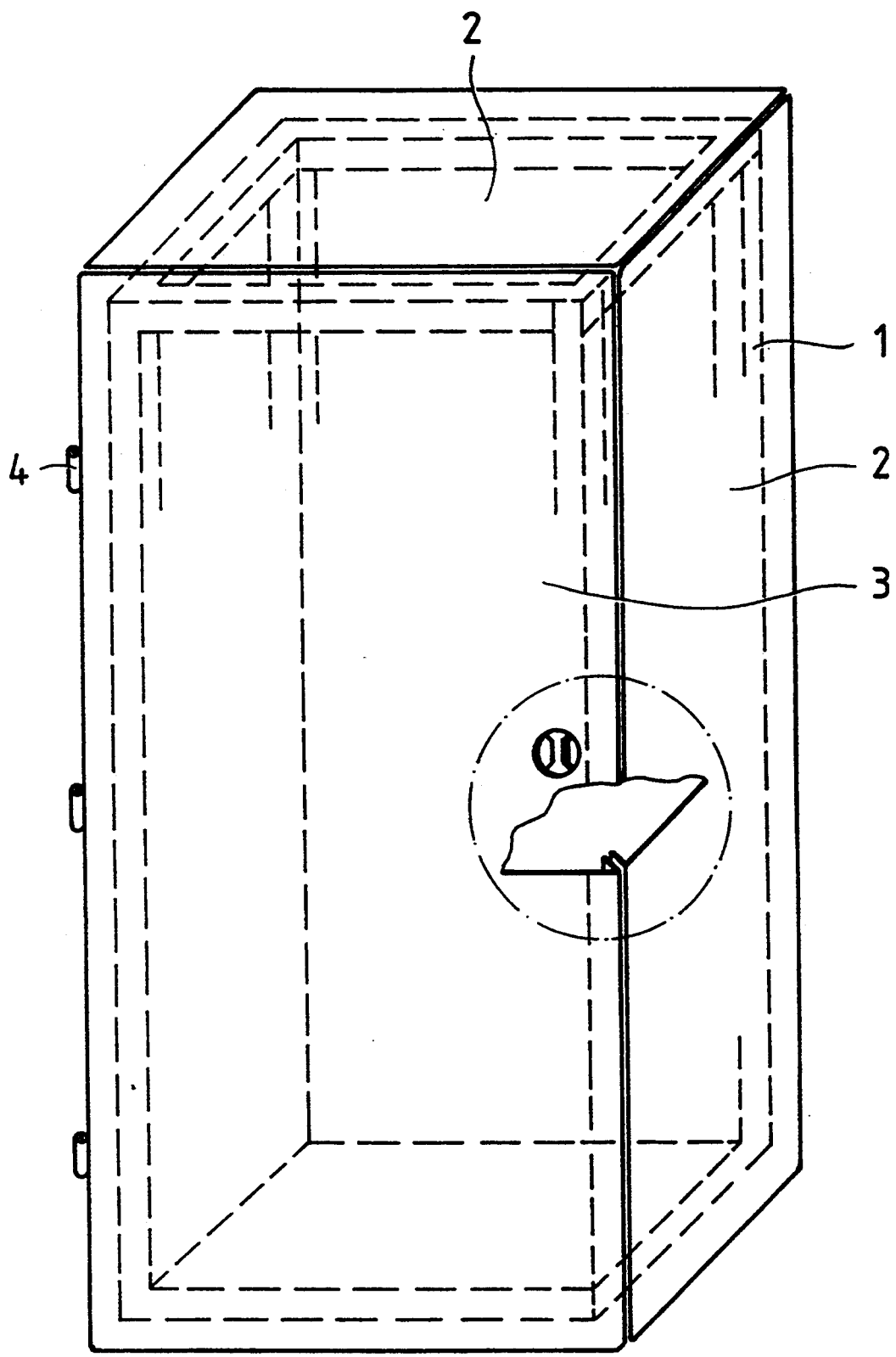
FIG. 1 is a simplified perspective view of an equipment cabinet having a door at the front.

The equipment cabinet shown in FIG. 1 in its closed state has as its supporting structure a rack 1 that imparts the required strength and rigidity to it and serves as a holder for insertable electrical and electronic units (not shown). Casing components 2 made for example, of sheet metal, are fixed to rack 1 so as to form a housing including the rear wall, sides, top and bottom of the equipment cabinet. A door 3, likewise made for example, of sheet metal, is pivotally fastened to the opening of the housing by means of hinges 4.

Figure 2:
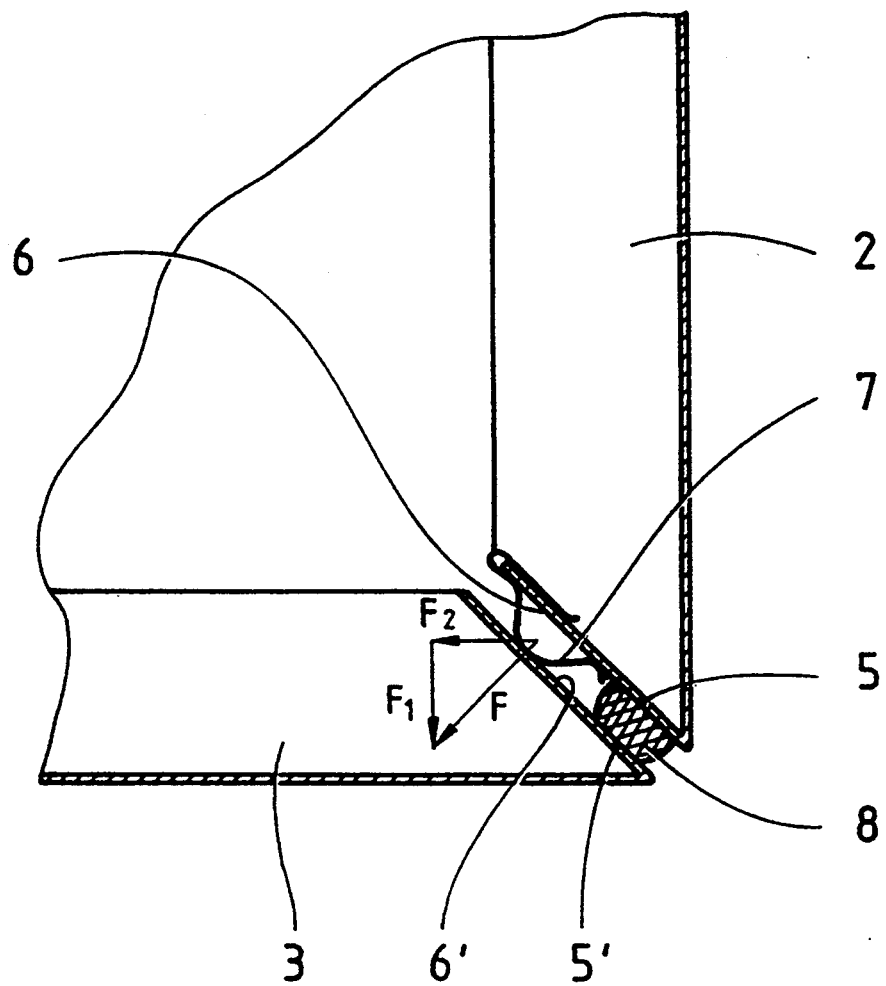
FIG. 2 is a horizontal enlarged scale sectional view of the right front corner of the equipment cabinet of FIG. 1.

As evident, in particular, from the enlarged sectional view of FIG. 2, door 3 as well as the end faces of casing components 2 disposed opposite thereto are each provided with peripheral edge strips 5 and 5', respectively, each being bent inwardly at an angle of about 45°. These edge strips 5, 5' support parallel sealing faces 6 and 6', respectively, which face one another at a slight distance.

Spring-elastic seals are provided between sealing faces 6 and 6' at edge strips 5 and 5'. These seals comprising a metallic, conducting contact strip 7 composed of rows of spring contacts and, or a sealing strip 8 made of a rubber-elastic material arranged parallel thereto. Contact strips 7 and sealing strips 8 extend around the entire frame of door 3 so that, in its closed state, door 3 is completely sealed against the stationary casing components 2 so that the cabinet is sealed against dust and moisture as well as interfering high frequency radiation.

FIG. 2 discloses, for example, for the conducting strip 7, the splitting of the spring force F into the two force components $F_1$ and $F_2$. Force component $F_1$ is directed perpendicular to the plane of door 3 and force component $F_2$ is directed parallel to the plane of the door. When door 3 is closed, it is only necessary to overcome the perpendicular force component $F_1$, while the parallel force component $F_2$ is absorbed by the hinges 4 (see FIG. 1). The splitting of the spring force exerted by sealing strip 7 is accomplished in a similar manner.

It will be understood that the above description of the present invention is susceptible to various modifications, changes and adaptations, and the same are intended to be comprehended within the meaning and range of equivalents of the appended claims.

What is claimed is:

1. An equipment cabinet for insertable electrical and electronic units, comprising:
   casing components forming a housing having an opening, said opening having a peripheral edge;
   a rack fastened within said housing for holding the insertable units;
   at least one door having open and closed positions and being pivotally attached to said housing, said at least one door having a peripheral edge disposed opposite and adjacent said opening peripheral edge when said door is in its closed position;
   first and second peripheral edge strips attached to said door and said opening peripheral edges, respectively, each said peripheral edge strip being bent inwardly to form an angle of approximately 45° relative to a major surface of the door and of the casing components, respectively, said door peripheral edge strip angle and said opening peripheral edge strip angle forming a complementary angle of 90° when said door is in its closed position;
   adjacent parallel sealing faces on said first and second peripheral edge strips and said sealing face on said first peripheral edge strip being parallel and adjacent to said sealing face on said second peripheral edge strip when said door is in its closed position; and
   at least one spring-elastic seal attached to at least one of said first and second peripheral edge strips and being between said sealing faces when said door is in its closed position, at least one of said spring-elastic seals comprising electrically conductive contact strips and said contact strips comprising rows of juxtaposed spring contacts.

* * * * *